US012007428B2

(12) United States Patent
Butler et al.

(10) Patent No.: US 12,007,428 B2
(45) Date of Patent: Jun. 11, 2024

(54) SYSTEMS AND METHODS FOR MULTIDIMENSIONAL DYNAMIC PART AVERAGE TESTING

(71) Applicant: Advantest Corporation, Tokyo (JP)

(72) Inventors: Kenneth Butler, San Jose, CA (US); Ira Leventhal, San Jose, CA (US); Constantinos Xanthopoulos, San Jose, CA (US); Alan Hart, San Jose, CA (US); Brian Buras, San Jose, CA (US); Keith Schaub, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 17/497,518

(22) Filed: Oct. 8, 2021

(65) Prior Publication Data

US 2023/0111543 A1    Apr. 13, 2023

(51) Int. Cl.
*G01R 31/26* (2020.01)

(52) U.S. Cl.
CPC ................. *G01R 31/2601* (2013.01)

(58) Field of Classification Search
CPC ............ G01R 31/2601; G01R 31/2607; G01R 31/2642; G01R 31/2608; G01R 31/2621; G01R 31/2632; G01R 31/263; G01R 31/2637; G01R 31/27; G01R 31/275; G01R 31/28; H01L 22/00
See application file for complete search history.

(56) References Cited

U.S. PATENT DOCUMENTS

| | | | |
|---|---|---|---|
| 2008/0249742 A1* | 10/2008 | Scott | G05B 23/0294 702/179 |
| 2017/0262860 A1* | 9/2017 | Teplinsky | G06Q 30/0185 |
| 2018/0364302 A1 | 12/2018 | Chieu | |

(Continued)

FOREIGN PATENT DOCUMENTS

| | | |
|---|---|---|
| CN | 104583789 A | 4/2015 |
| TW | 201226941 A | 7/2012 |
| WO | 2019202595 | 10/2019 |

OTHER PUBLICATIONS

Nektar Xama et al.: "Avoiding Mixed-Signal Field Returns by Outlier Detection of Hard-to-Detect Defects based on Multivariate Statistics," 2020 IEEE European Test Symposium (ETS), May 25, 2020, pp. 1-6.

(Continued)

*Primary Examiner* — Tarun Sinha
*Assistant Examiner* — James I Burris (57) ABSTRACT

Embodiments of the present invention provide systems and methods for multidimensional parts average testing for testing devices and analyzing testing results to detect outliers according to embodiments of the present invention. The testing can include calculating multivariate (e.g., bivariate) statistics using delta measurements of like devices, a ratio of measurements, or principal component analysis that identifies eigenvectors and eigenvalues to define meta parameters, for example. Raw test result data can be converted to residual space and robust regression can be performed to prevent outlier results from influencing regression, thereby reducing overkill advantageously.

20 Claims, 7 Drawing Sheets

(56) References Cited

U.S. PATENT DOCUMENTS

2019/0160494 A1  5/2019  Linde et al.

OTHER PUBLICATIONS

Manuel J. Moreno-Lizaranzu et al.: "Improving Electronic Sensor Reliability by Robust Outlier Screening," Sensors 2013, Oct. 9, 2013, vol. 13, No. 10, pp. 13521-13542.
Douglas Pihlaja: "Real Time Dynamic Application of Part Average Testing (PAT) at Final Test," CS Mantech Conference, May 13, 2013, pp. 165-168.
"Guidelines For Part Average Testing," Automotive Electronics Council, AEC-Q001 Rev-D, Dec. 9, 2011, pp. 1-12.
Dynamic Parts Average Testing in Real-time; Pintail Technologies, Inc.; www.pintail.com; Southwest Test Workshop; Jun. 8, 2005; 16 pages.

* cited by examiner

SYSTEMS AND METHODS FOR MULTIDIMENSIONAL DYNAMIC PART AVERAGE TESTING

FIELD

Embodiments of the present invention generally relate to the field of device testing. More specifically, embodiments of the present invention relate to methods and systems for part average testing.

BACKGROUND

A device or equipment under test (e.g., a DUT) is typically tested to determine the performance and consistency of the device before the device is sold. The device can be tested using a large variety of test cases, and the result of the test cases is compared to an expected output result. When the result of a test case does not match the expected output value, the device can be considered a failed device or outlier, and the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer or other electronic device. By removing defective or unsatisfactory chips at manufacture using ATE, the quality of the yield can be significantly improved.

The field of automotive device testing factors in additional safety considerations; in some cases, automotive devices are tested using a zero-tolerance approach. Part average testing (PAT) is a type of device testing based on statistical analysis that identifies parts (e.g., wafers or dies) having characteristics significantly different from other parts in the same lot, wafer, or sub-wafer neighborhood. The differences in these parts can indicate which parts are expected to fail (e.g., fall outside of acceptable limits). Generally, part average testing collects data from previously tested parts and compares the mean (or median) of previous measurements to the current part. If the measurements for the current part are outside of a certain range, the part is declared an outlier. The range can be based on the number of standard deviations from the mean or based on the computation of inter-quartile range values, for example.

Unfortunately, these conventional approaches to part average testing are limited to use on individual test parameters using univariate statistical methods. Moreover, current approaches to setting limits for parts average testing are somewhat simplistic and can result in larger than desired overkill.

SUMMARY

What is needed is a multivariate approach to device testing that outperforms univariate approaches in detecting outlier units and limiting overkill and escapes. Accordingly, embodiments of the present invention provide systems and methods for multidimensional parts average testing for testing devices and analyzing testing results to detect outliers according to embodiments of the present invention. The testing can include calculating multivariate (e.g., bivariate) statistics using delta measurements of like devices, a ratio of measurements, or principal component analysis that identifies eigenvectors and eigenvalues to define meta parameters, for example.

According to one embodiment, a method of dynamic parts average testing is disclosed. The method includes determining testing limits based on historic testing result data, testing a plurality of devices according to the testing limits to obtain test results, computing multivariate statistics using the test results, computing mean or median values of the multivariate statistics, computing differences between the multivariate statistics and the mean or median multivariate values, updating the testing limits based on the mean or median values to produce updated testing limits, and identifying outliers of the plurality of devices based on the mean or median values and the updated testing limits.

According to some embodiments, the method includes determining significant measurements for testing by performing at least one of principal component analysis (PCA), independent component analysis (ICA), auto encoding, machine learning, or other similar analytical methods which identify significant factors.

According to some embodiments, computing multivariate statistics using the test results includes at least one of: forming bivariate pairs, forming ratios, and forming deltas.

According to some embodiments, the computing multivariate statistics using the test results includes clustering the test results according to a result type.

According to some embodiments, the method includes converting the mean or median values to residual space using a non-linear, non-monotonic transformation to amplify outlier results.

According to some embodiments, the method includes removing outlier results before the updating the testing limits based on the mean or median values.

According to some embodiments, the method includes performing reweighted least square regression before the updating the testing limits based on the mean or median values.

According to another embodiment, an apparatus for performing dynamic parts average testing is disclosed. The apparatus includes a processor, and a memory in communication with the processor for storing test data and instructions, the processor executes instructions to perform a method of multivariate (or multidimensional) parts average testing, the method including determining testing limits based on historic testing result data, testing a plurality of devices according to the testing limits to obtain test results, computing multivariate statistics using the test results, computing mean or median values of the multivariate statistics, computing differences between the multivariate statistics and the mean or median multivariate values, updating the testing limits based on the mean or median values to produce updated testing limits, and identifying outliers of the plurality of devices based on the mean or median values and the updated testing limits.

According to some embodiments, the method includes determining significant measurements for testing by performing at least one of: principal component analysis (PCA), independent component analysis (ICA), auto encoding, machine learning, or other similar analytical methods which identify significant factors.

According to some embodiments, computing multivariate statistics using the test results includes at least one of: forming bivariate pairs, forming bivariate ratios, and forming bivariate deltas.

According to some embodiments, computing multivariate statistics using the test results includes clustering the test results according to a result type.

According to some embodiments, the method includes converting the mean or median values to residual space using a non-linear, non-monotonic transformation to amplify outlier results.

According to some embodiments, the method includes removing outlier results before the updating the testing limits based on the mean or median values.

According to some embodiments, the method includes performing reweighted least square regression before the updating the testing limits based on the mean or median values.

According to another embodiment, one or more non-transitory computer-readable medium including program instructions stored thereon that are executable by one or more processors implement a method including determining testing limits based on historic testing result data, testing a plurality of devices according to the testing limits to obtain test results, computing multivariate statistics using the test results, computing mean or median values of the multivariate statistics, computing mean or median values of the multivariate statistics, updating the testing limits based on the mean or median values to produce updated testing limits, and identifying outliers of the plurality of devices based on the mean or median values and the updated testing limits.

According to some embodiments, the method includes determining significant measurements for testing by performing at least one of: principal component analysis (PCA), independent component analysis (ICA), auto encoding, machine learning, or other similar analytical methods which identify significant factors.

According to some embodiments, computing multivariate statistics using the test results includes at least one of: forming bivariate pairs, forming ratios, and forming deltas.

According to some embodiments, computing multivariate statistics using the test results includes clustering the test results according to a result type.

According to some embodiments, the method includes converting the mean or median values to residual space using a non-linear, non-monotonic transformation to amplify outlier results.

According to some embodiments, the method includes accessing e-test data or data produced during another manufacturing step.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 6) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Systems and Methods for Multidimensional Dynamic Part Average Testing

Embodiments of the present invention provide systems and methods for multidimensional parts average testing for testing devices and analyzing testing results to detect outliers according to embodiments of the present invention. The testing can include calculating multivariate (e.g., bivariate) statistics using delta measurements of like devices, a ratio of measurements, or principal component analysis that identifies eigenvectors and eigenvalues to define meta parameters, for example.

Part Average Testing (PAT) conventionally uses fixed outlier limits for a specific test parameter that are set prior to processing a set of material. For example, the testing parameter can be based on a computation of inter-quartile range values of historical test data. In this way, parts (e.g., wafers, dies, materials, devices) having characteristics significantly different from the normal distribution of other parts in the same lot can be identified. The differences in these parts can indicate which parts are expected to fail. Dynamic PAT (DPAT) can be used to provide non-fixed limits that can be updated automatically over time as new test results become available.

Figure 1:
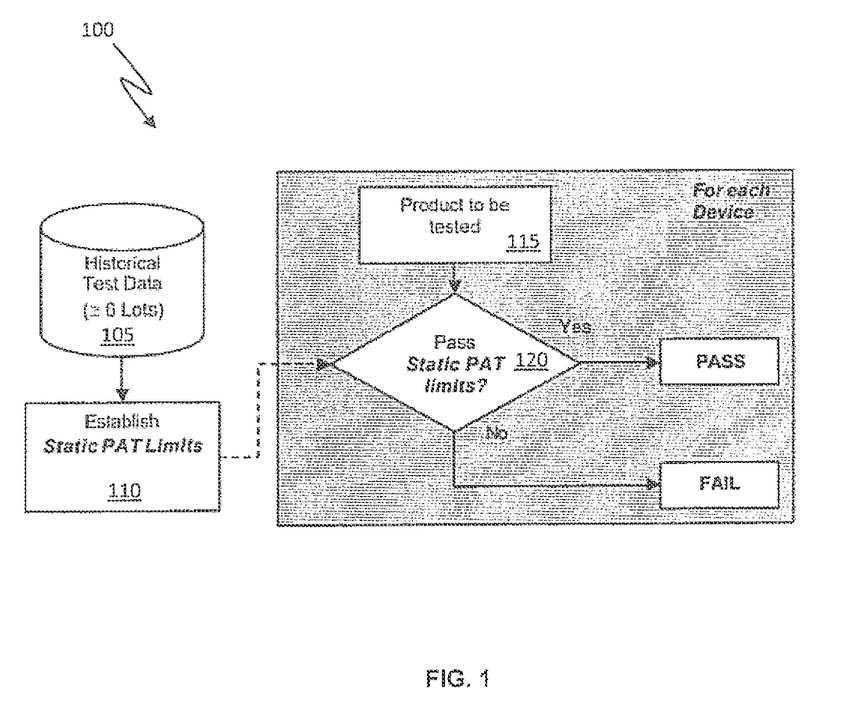
FIG. 1 is a block diagram and data flow diagram of an exemplary univariate static PAT process.

FIG. 1 is a flow chart depicting an exemplary computer-implemented process 100 for determining static PAT limits and performing Part Average Testing (PAT) based on historical test data 105. As depicted in FIG. 1, historical test data 105 is used to establish static PAT limits 110. Devices (e.g., device 115) are then tested to determine if they pass or fail the static PAT limits using static PAT screening 120. Devices that fail can be binned based on their performance.

Figure 2:
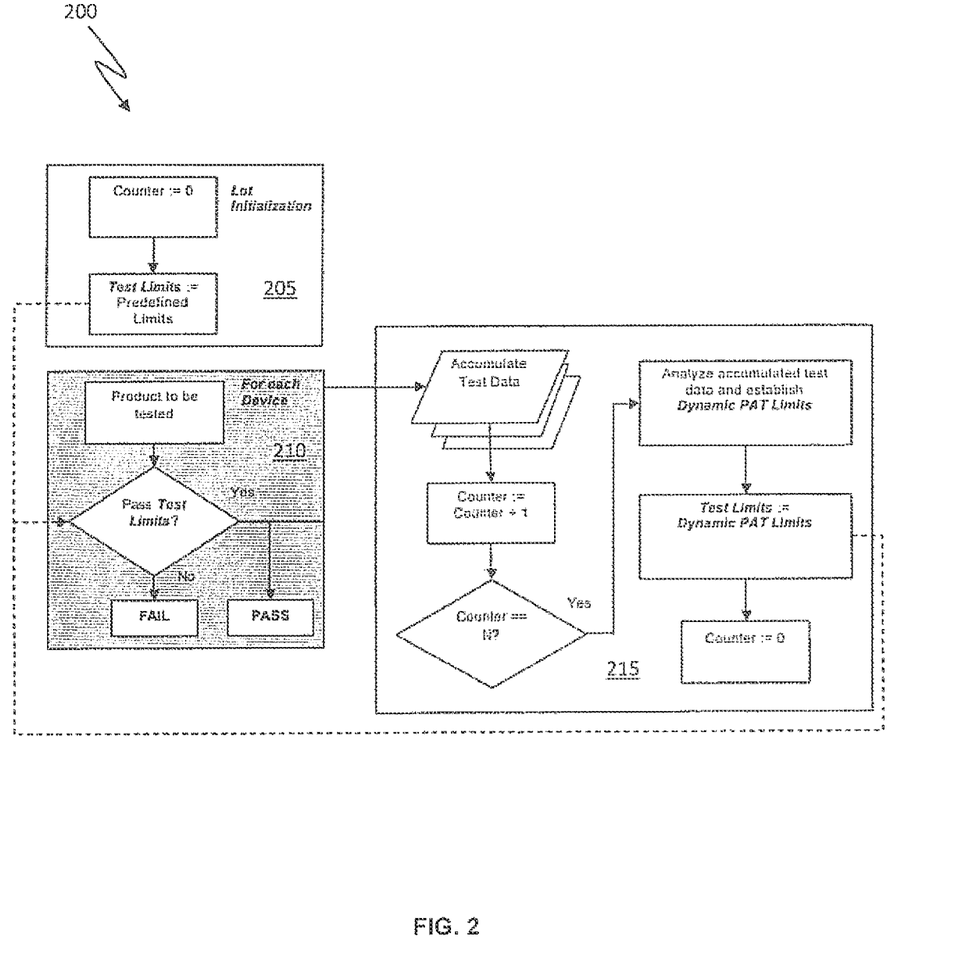
FIG. 2 is a block diagram and data flow diagram of an exemplary univariate PAT process that dynamically updates PAT limits according to accumulated test data according to embodiments of the present invention.

FIG. 2 depicts an exemplary DPAT test process 200 for packaged products that dynamically computes and adjusts PAT limits as units are being tested according to embodiments of the present invention. As depicted in FIG. 2, the PAT limits are established dynamically based on accumulated test data once a sufficient number of tests have been performed. Lot initiation stage 205 is performed using predefined PAT limits, and the PAT limits are adjusted during test analysis stage 215 based on the test data accumulated during testing phase 210. While dynamic PAT is an efficient approach to part average testing, the analysis of test results typically employs only univariate statistical methods limited to use on individual test parameters as defined according to Automotive Electronics Council (AEC) standards. Moreover, existing approaches to PAT often result in larger than desired overkill when performed according to AEC standards.

Accordingly, embodiments of the present invention can screen devices using multiple parameters in one statistical metric, such as a bivariate parameter. In some embodiments, two leakage measurements are combined to screen for devices that fall outside of predefined limits of the screening process. Some embodiments use multivariate statistics of any dimension two or larger to perform the screening process. Embodiments of the present invention can perform parallel execution for screening multiple devices and can implement robust statistics based on historical testing data. A user (e.g., author or admin) of the test equipment performing the screening can indicate which test measurements are intended to be utilized for screening purposes using n number of screening parameters. The number of test results used to compute a number y of outlier results.

Figure 3:
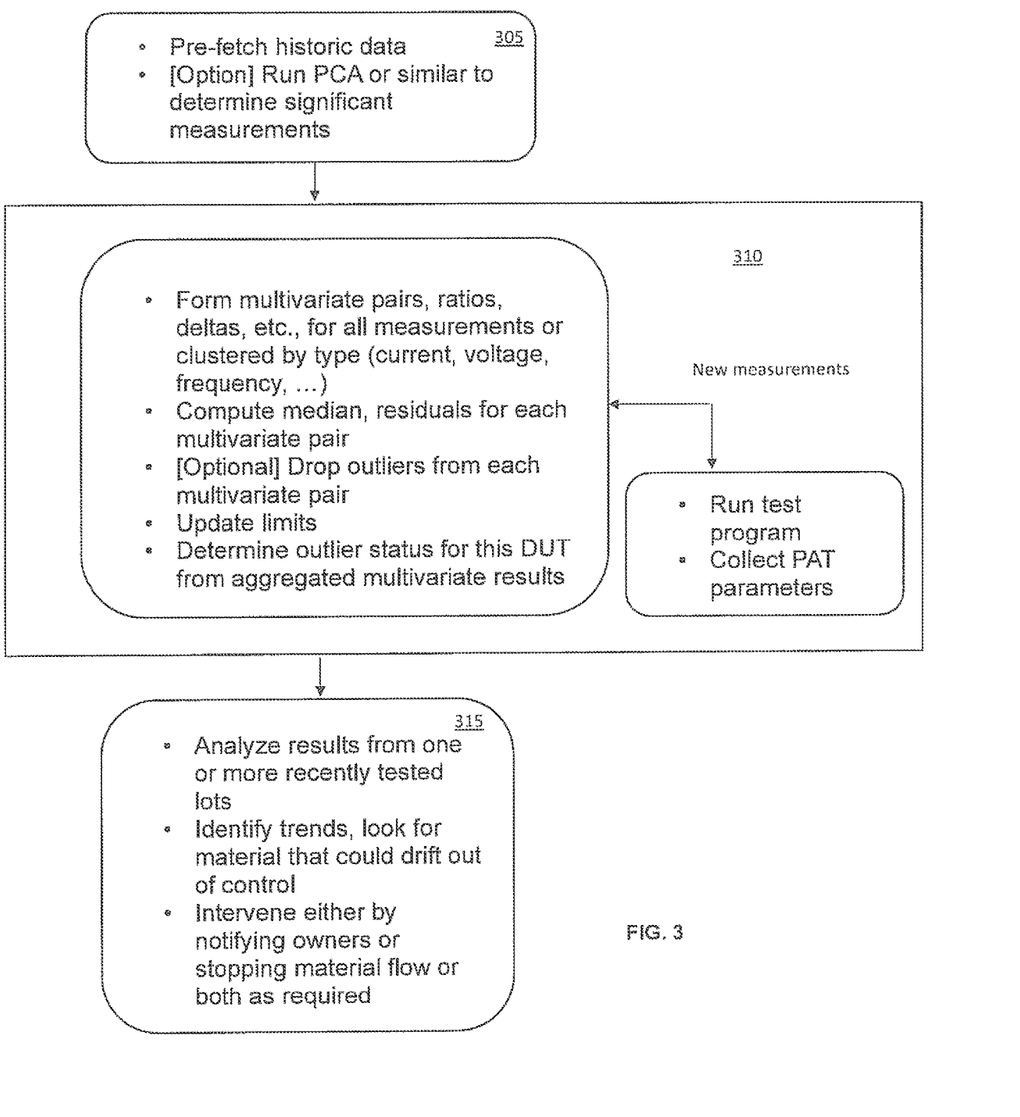
FIG. 3 is a flow chart of an exemplary multivariate PAT process that dynamically updates PAT limits according to accumulated test data using multivariate statistical computations according to embodiments of the present invention.

FIG. 3 depicts an exemplary multidimensional parts average testing process 300 for testing devices and analyzing testing results according to embodiments of the present invention. Testing process 300 includes lot start phase 305, test execution phase 310, and post-test execution phase 315. A DUT can be screened using multiple parameters in one statistical metric. For example, the screening can include calculating bivariate statistics using delta measurements of like devices, a ratio of measurements, or principal component analysis that identifies eigenvectors and eigenvalues to define meta parameters.

Lot start phase 305 is performed before testing to determine the initial limits of the test program. Lot start phase 305 can include pre-fetching stored historic data and other related information to seed the limit computations for each screening measurement. The historic data can be stored locally at the testing system, or fetched from a local or remote database or host. The historic data can include data from other manufacturing lots of the same device that have already tested, testing insertion data of the same lot performed at an earlier time, or any combination of the two. Data from a probe phase of wafer testing can be used to establish initial testing limits for package testing after the wafer has been cut. The historic data can also include test data from e-test or parametric testing collected during wafer fabrication, or other data obtained as the device is being produced, especially in the case of materials that are serialized during production for tracking purposes. Fixed testing limits can also be provided manually by a user during lot start phase 305.

Test execution phase 310 includes collection of PAT parameters and test program execution for a device under test. In one exemplary process for determining outlier status during testing, bivariate pairs, ratios, deltas, etc., are formed for all measurements or clusters of measurements sorted by type (e.g., current, voltage, frequency, etc.), and the medians and residuals are calculated for each bivariate pair. New measurements accumulated during testing can be used to update testing limits during testing, and outlier status can be determined using aggregated bivariate results. Robust regression (e.g., reweighted least squares) can optionally be performed during test execution phase 310 to drop probable outliers from each bivariate pair before updating the testing limits using the test results.

According to some embodiments, multidimensional parts average testing process 300 includes comparing the DUT to the signature of a set of previously tested devices. The DUT is tested using parameters established according to a lot having a signature that best matches a signature of the DUT (e.g., the most similar wafer or lot).

According to some embodiments, baseline testing limits are determined according to a previous number of tests performed for the same lot (e.g., 50 or 100 tests). One approach is to determine the median of the previous measurements to estimate the parameter value for next DUT (e.g., die). The difference between the result of the DUT and the median value is computed (the "residual"). The DUT may be determined to be an outlier (failed) when the value of the residual is significant compared to the baseline.

Data that is fed forward for updating the testing limits can be used to establish separate limits for different physical portions of the material subjected to the testing process. For example, c-test data, which is usually collected on a limited number of sites on a wafer, can be used to adjust the limits applied to new material from the same portion of the wafer. Different limits can be applied based on which zone of the wafer the material comes from. The zones can be defined as radials or quartiles, for example. Reticle shots on the wafer can be tracked and used to determine which reticle shot was used for each unit in the baseline. The limits can be set according to what reticle shot was used for each unit, for example. In another example, units are compared according to their position within the reticle, such as the top left position of a 2×2 reticle shot.

After the screening measurements have been performed in the test program, the measurements are used to perform the screening computation. For example, the measurement data can be passed to a screening computer system in a single call (as opposed to separate calls for each test as it is executed), thereby saving communication overhead. Bivariate statistics are computed for all (n)(n−1) combinations of any two parameters. For example, the bivariate statistics can include ratios ($n_i/n_j$) or deltas ($n_i-n_j$) or any other combination of two parameters appropriate for outlier screening. For each combination of parameters, a median statistic is computed by using the previous y bivariate metrics. The median statistics then become the expected value for the current device/die of interest.

Post-test execution phase 315 is performed after test execution 310 to analyze results from one or more recently tested lots. This phase can include identifying measurement trends and identifying material that can drift out of control, in which case the testing system can produce a notification and/or automatically stop testing the devices in the material flow. According to some embodiments, an additional supervisory layer of functionality is provided during testing for quality enhancement. For example, all measurement and test result data can be maintained and aggregated across all devices being tested, and the aggregated data can be analyzed to identify trends. If a trend is identified that indicates a possibility of quality excursion, the testing system can intervene.

The time period of aggregation and intervention can vary. In one example, the time period is limited to the duration for testing a single lot of material, and the intervention is immediate. In this case, testing ceases and diagnostic processes begin. In another example, the duration can be extended beyond the testing of a single lot of material, and the intervention can be a notification of responsible parties of the trend that is detected across multiple lots of material (e.g., a message, email, or other indication), and production can be stopped or dynamically modified. In this way, the functionality of the DPAT statistics is extended beyond the outcome for a single device by using the DPAT statistics to monitor aggregated results and trends.

Figure 4:
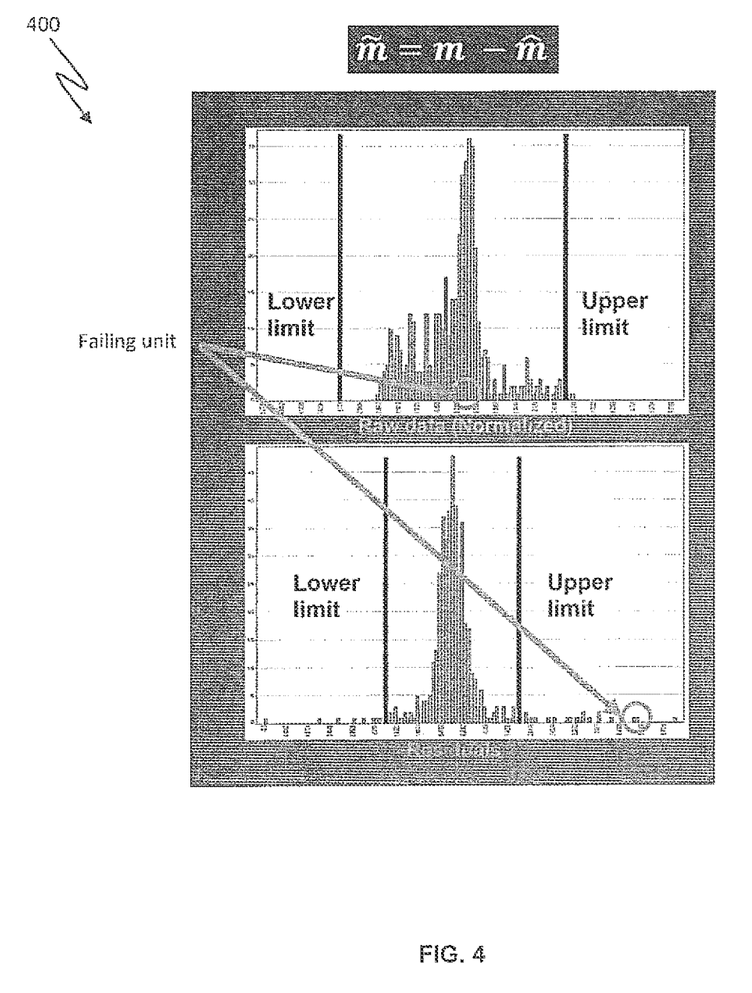
FIG. 4 depicts exemplary PAT results shown before and after transformation to residual space is performed according to embodiments of the present invention.

As depicted in FIG. 4, according to embodiments of the present invention, the difference between the median and the measurement results (the "residual") is computed. For example, the residual for the most recent die can be compared to the residuals of the previous y measurements and the die distribution can be reordered accordingly. In the example of FIG. 4, a non-linear, non-monotonic transformation is applied to the raw testing data to transform the raw data to residual space. This approach can amplify outlier behavior so that previously undetected failed devices are visible to outlier screening. The residual transformation can be performed in two passes. According to some embodiments, outliers from the population of y metrics can be removed prior to the median and residual computations to allow for robust statistics.

Figure 5:
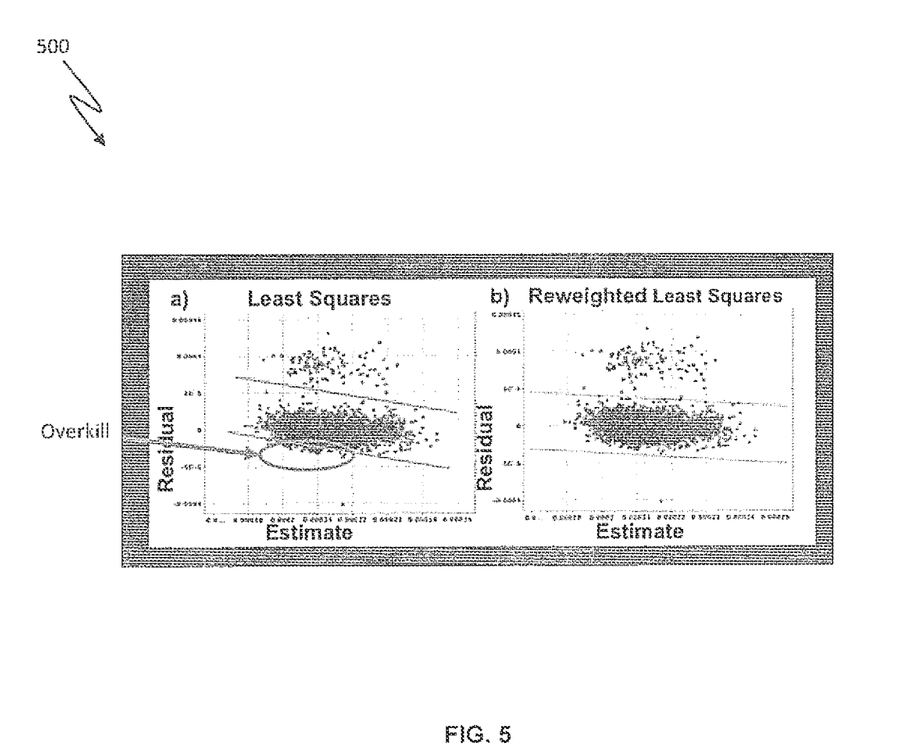
FIG. 5 depicts exemplary PAT results produced using multivariate statistical computations shown before and after robust data regression is performed according to embodiments of the present invention.

As depicted in FIG. 5, robust regression can be used to focus on modeling good device behavior. Robust regression can prevent outliers in a population from influencing regression, thereby reducing overkill advantageously. For example, probable outliers can be removed before recomputing the testing limits, and the current device under test can be compared to the new baseline. In the example depicted in FIG. 5, reweighted least squares regression is performed to identify gross outliers which are then removed from final regression calculation. In this way, the overkill of suspected outliers is prevented when the limits are adjusted using robust regression.

According to some embodiments, multiple outlier screening techniques and/or multiple limit-setting strategies can be applied to the bivariate statistics so that a collection of results exist for each item. This approach may be referred to as an ensemble method. Outlier status can be determined based on the number of bivariate statistics which exceed the residual limits. The threshold can vary from 1 through (n)(n−1) inclusive. If multiple outlier techniques are applied to each bivariate statistic, the threshold can be adjusted beyond (n)(n−1).

When ensemble methods are employed, the final outlier decision can be limited to only those methods within the ensemble that are shown to perform accurately (e.g., having a stronger signal and/or better predictive results). For example, after-the-fact analysis can be performed to determine which specific outlier metrics were predictive of an outcome of interest (e.g., device failure during burn-in, device failure in the field, etc.) This approach may require device traceability and feeding results back into the test process for subsequent material. Another approach determines how far an outlier device lies from the center of the distribution of statistics for other devices, and more weight is applied to the outlier analysis outcomes that are very close to the upper or lower outlier limits.

In some cases, using a starting number of measurements n that is relatively large, or using higher dimensionality statistics than bivariate, can cause various issues commonly known as the "Curse of dimensionality." Therefore, according to some embodiments, measurements are grouped by similarity (e. g., current measurements, voltage measurements, frequency measurements, etc.) and only multivariate combinations are generated within the groups to avoid excessively complex computations. Alternatively, measurements can be clustered according to device functionality. For example, all measurements related to the performance of a particular portion of circuitry (e. g., a block which implements an analog to digital conversion) could be grouped in one cluster, and performance measurements for the power management unit could be grouped in a second cluster. A preliminary analysis can be performed to generate specific combinations of parameters, such as principal component analysis (PCA), auto encoding, or machine learning, either statically before any testing is done, at the beginning of testing, or periodically throughout the testing process.

While any number of different testing parameters can be used for testing and analysis, some of the most critical parameters according to embodiments include:
Resistance
Capacitance
Inductance
Memory Stress
Timing/frequency
Fuse/trim/non-volatile memory
I/O and DC
TX/RX
Voltage
Analog
Current monitoring (e.g., $I_{DDQ}$ leakage)

It should be noted that embodiments of the present invention do not require visual inspection data and can be implemented using only conventional test program measurement data.

According to some embodiments, each device tested can be categorized using hard bins and/or soft bins, for example, for classification of the material being tested, so that different bins can be assigned different downstream test flows.

According to some embodiments, conventional DPAT statistical measures using univariate statistics can also be computed along with multivariate statistics for use in screening decisions, as opposed to replacing conventional DPAT with only multivariate statistics.

According to some embodiments, failed parts are sorted (e.g., binned). All outlier computations can be binned, for example, according to which test(s) were failed, the value of the residual, etc.

Figure 6:
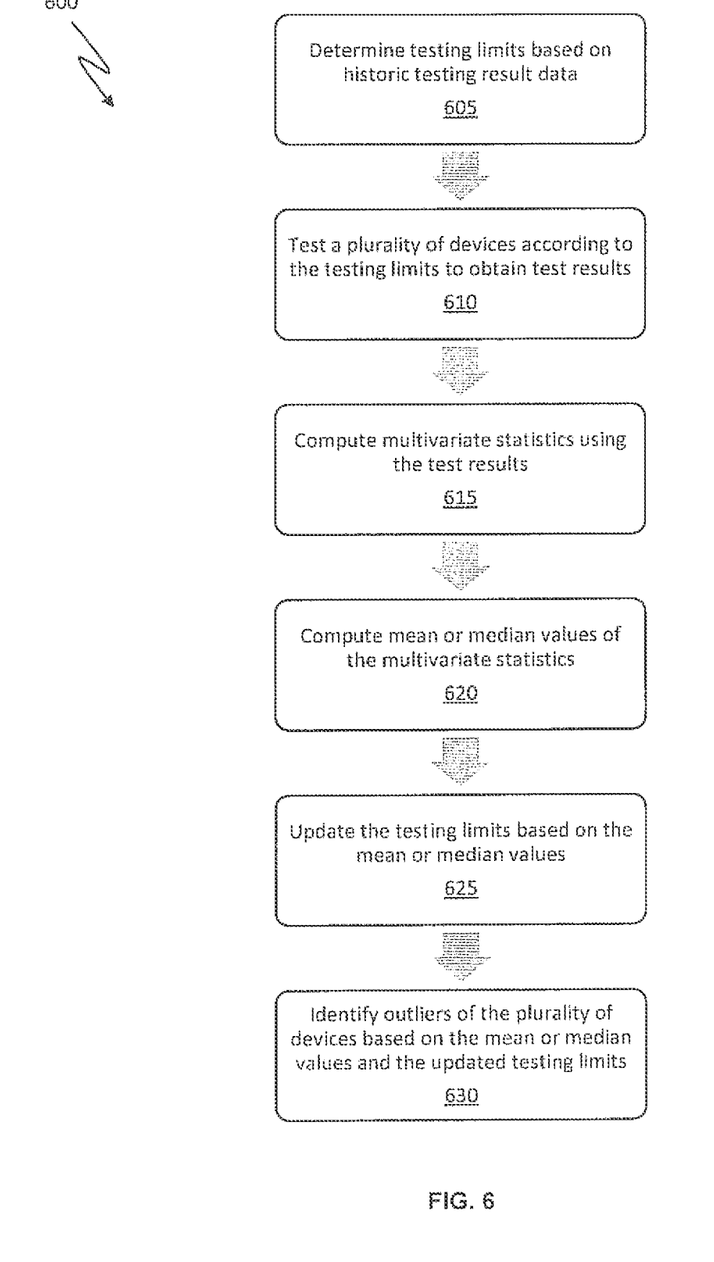
FIG. 6 is a flow chart depicting an exemplary sequence of computer implemented steps of a computer-controlled process for automatically testing devices using multivariate statistical computations and dynamic PAT to detect outlier devices.

FIG. 6 is a flow chart depicting an exemplary automatic computer implemented multidimensional parts average testing process 600 for testing devices and analyzing testing results to detect outliers according to embodiments of the present invention. The testing can include calculating multivariate (e.g., bivariate) statistics using delta measurements of like devices, a ratio of measurements, or principal component analysis that identifies eigenvectors and eigenvalues to define meta parameters, for example.

At step 605, testing limits are determined. The testing limits define acceptable bounds for devices that are tested to identify outliers. The testing limits can be determined based on historic testing data that is accessed from memory or from a local or remote storage system, for example. The historic data can be based on the previous 50 or 100 units tested from the same lot, or even the entire lot, for example. According to some embodiments, the testing limits are determined according to stored c-test data or data produced during a previous manufacturing step, and can be augmented with statistical or topologically correlated data, for example.

Step 605 can also include determining significant measurements for testing by performing well-known techniques such as principal component analysis, auto encoding, or machine learning, for example.

At step 610, a plurality of devices is tested according to the defined testing limits to obtain test results. The raw testing results are stored and can be aggregated, according to some embodiments, to identify trends during or after testing.

At step 615, multivariate statistics are computed using the test results. This step can include forming bivariate pairs, forming bivariate ratios, and forming bivariate deltas, for example, although any suitable multivariate statistical calculation can be used.

At step 620, mean or median values of the multivariate statistics are computed. The mean or median values of the multivariate statistics can optionally be converted to residual space to amplify outlier behavior so that previously undetected failed devices are visible to outlier screening. The residual transformation can be performed in two passes. According to some embodiments, outliers from the population of y metrics can be removed prior to the median and residual computations to allow for robust statistics. Robust regression is optionally performed to prevent outliers in a population from influencing regression, thereby reducing overkill advantageously. Step 620 can include performing reweighted least squares regression, for example.

At step 625, the testing limits are updated based on the mean or median values and/or the residuals. According to some embodiments, outliers are removed before updating the testing limits.

At step 630, outliers of the plurality of devices are identified based on the mean or median values and/or residuals and the updated testing limits. The outliers can be considered failed devices and/or can be binned according to performance, the testing parameter that failed, etc.

Exemplary Test System

Figure 7:
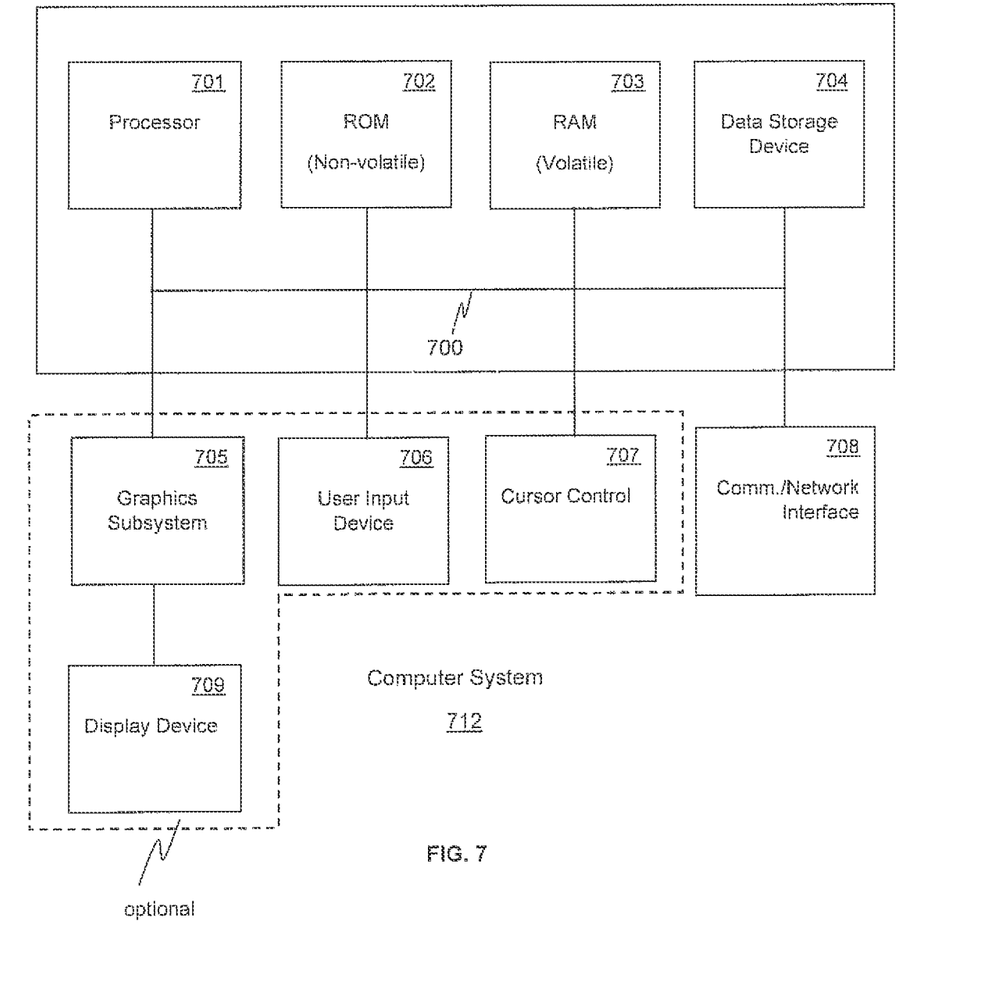
FIG. 7 depicts an exemplary computer platform upon which embodiments of the present invention may be implemented.

Embodiments of the present invention are drawn to electronic systems for multidimensional parts average testing for testing devices and analyzing testing results to detect outliers according to embodiments of the present invention. The testing can include calculating multivariate (e.g., bivariate) statistics using delta measurements of like devices, a ratio of measurements, or principal component analysis that identifies eigenvectors and eigenvalues to define meta parameters, for example. The following discussion describes one such exemplary electronic system or computer system that can be used as a platform for implementing embodiments of the present invention. For example, computer system 712 can be configured to interface with a testing system or apparatus that includes a socket for receiving a device, a thermal management system, a power supply, and an electronic signaling system for testing the device.

In the example of FIG. 7, the exemplary computer system 712 includes a central processing unit (CPU) 701 for running software applications and an operating system. Random access memory 702 and read-only memory 703 store applications and data for use by the CPU 701. Data storage device 704 provides non-volatile storage for applications and data and may include fixed disk drives, removable disk drives, flash memory devices, and CD-ROM, DVD-ROM or other optical storage devices. The data storage device 704 or the memory 702/703 can store historic and real-time testing data (e.g., test results, limits, computations, etc.). The optional user inputs 706 and 707 comprise devices that communicate inputs from one or more users to the computer system 712 (e.g., mice, joysticks, cameras, touch screens, keyboards, and/or microphones). A communication or network interface 708 allows the computer system 712 to communicate with other computer systems, networks, or devices via an electronic communications network, including wired and/or wireless communication and including an Intranet or the Internet.

The optional display device 710 may be any device capable of displaying visual information, e.g., the final scan report, in response to a signal from the computer system 712 and may include a flat panel touch sensitive display, for example. The components of the computer system 712, including the CPU 701, memory 7021703, data storage 704, user input devices 706, and graphics subsystem 705 may be coupled via one or more data buses 700.

Embodiments of the present invention are thus described. While the present invention has been described in particular embodiments, it should be appreciated that the present invention should not be construed as limited by such embodiments, but rather construed according to the following claims.

What is claimed is:

1. A method of dynamic parts average testing, the method comprising:
   determining testing limits based on historic testing result data;
   testing a plurality of portions of a material according to the testing limits to obtain test results;
   computing multivariate statistics using the test results;
   computing mean or median values of the multivariate statistics;
   computing differences between the multivariate statistics and the mean or median values;
   updating the testing limits based on the mean or median values to produce updated testing limits;
   identifying a trend indicating an out of control material drift of the material based on the mean or median values and the updated testing limits; and
   halting testing of the plurality of portions of the material responsive to the identifying the trend.

2. The method as described in claim 1, further comprising determining significant measurements for testing by performing at least one of: principal component analysis (PCA); independent component analysis (ICA); auto encoding; or machine learning.

3. The method as described in claim 1, wherein the computing multivariate statistics using the test results comprises at least one of: forming pairs; forming ratios; and forming deltas.

4. The method as described in claim 1, wherein the computing multivariate statistics using the test results comprises clustering the test results according to a result type.

5. The method as described in claim 1, further comprising converting the mean or median values to residual space using a non-linear, non-monotonic transformation to amplify outlier results.

6. The method as described in claim 1, further comprising removing outlier results before the updating the testing limits based on the mean or median values.

7. The method as described in claim 1, further comprising performing reweighted least square regression before the updating the testing limits based on the mean or median values.

8. An apparatus for performing dynamic parts average testing, the apparatus comprising:
   a processor; and
   a memory in communication with the processor for storing test data and instructions, wherein the processor executes instructions to perform a method of multivariate parts average testing, the method comprising:
   determining testing limits based on historic testing result data;
   testing a plurality of portions of a material according to the testing limits to obtain test results;
   computing multivariate statistics using the test results;
   computing mean or median values of the multivariate statistics;
   computing differences between the multivariate statistics and the mean or median values;
   updating the testing limits based on the mean or median values to produce updated testing limits;
   identifying a trend indicating an out of control material drift of the material based on the mean or median values and the updated testing limits; and
   halting testing of the plurality of portions of the material responsive to the identifying the trend.

9. The apparatus as described in claim 8, wherein the method further comprises determining significant measurements for testing by performing at least one of:
   principal component analysis (PCA); auto encoding; or machine learning.

10. The apparatus as described in claim 8, wherein the computing multivariate statistics using the test results comprises at least one of: forming bivariate pairs; forming bivariate ratios; and forming bivariate deltas.

11. The apparatus as described in claim 8, wherein the computing multivariate statistics using the test results comprises clustering the test results according to a result type.

12. The apparatus as described in claim 8, wherein the method further comprises converting the mean or median values to residual space using a non-linear, non-monotonic transformation to amplify outlier results.

13. The apparatus as described in claim 8, wherein the method further comprises removing outlier results before the updating the testing limits based on the mean or median values.

14. The apparatus as described in claim 8, wherein the method further comprises performing reweighted least square regression before the updating the testing limits based on the mean or median values.

15. One or more non-transitory computer-readable medium comprising program instructions stored thereon that are executable by one or more processors to implement a method comprising:
   determining testing limits based on historic testing result data;
   testing a plurality of portions of a material according to the testing limits to obtain test results;
   computing multivariate statistics using the test results;
   computing mean or median values of the multivariate statistics;
   computing differences between the multivariate statistics and the mean or median values;
   updating the testing limits based on the mean or median values to produce updated testing limits;
   identifying a trend indicating an out of control material drift of the material based on the mean or median values and the updated testing limits; and
   halting testing of the plurality of portions of the material responsive to the identifying the trend.

16. The non-transitory computer-readable medium as described in claim 15, wherein the method further comprises determining significant measurements for testing by performing at least one of: principal component analysis (PCA); independent component analysis (ICA); auto encoding; or machine learning.

17. The non-transitory computer-readable medium as described in claim 15, wherein the computing multivariate statistics using the test results comprises at least one of: forming bivariate pairs; forming ratios; and forming deltas.

18. The non-transitory computer-readable medium as described in claim 15, wherein the computing multivariate statistics using the test results comprises clustering the test results according to a result type.

19. The non-transitory computer-readable medium as described in claim 15, wherein the method further comprises converting the mean or median values to residual space using a non-linear, non-monotonic transformation to amplify outlier results.

20. The non-transitory computer-readable medium as described in claim 15, wherein the determining testing limits based on historic testing result data comprises accessing at least one of: e-test data; data produced during a previous manufacturing step; statistically correlated data; or topologically correlated data.

* * * * *